(12) United States Patent
Lee

(10) Patent No.: US 6,455,396 B1
(45) Date of Patent: Sep. 24, 2002

(54) SOI SEMICONDUCTOR DEVICE CAPABLE OF PREVENTING FLOATING BODY EFFECT

(75) Inventor: Jong Wook Lee, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/955,028

(22) Filed: Sep. 19, 2001

Related U.S. Application Data

(62) Division of application No. 09/468,518, filed on Dec. 21, 1999, now Pat. No. 6,313,507.

(30) Foreign Application Priority Data

Dec. 24, 1998 (KR) .............................................. 98-58550

(51) Int. Cl.⁷ ........................... H01L 21/30; H01L 24/46
(52) U.S. Cl. ...................... 438/455; 438/149; 438/406; 438/459
(58) Field of Search ................................ 438/455, 149, 438/151, 153, 154, 164, 219, 400, 404, 406, 459, 977, 300, 303, 304, 305; 257/347–353, 382–412

(56) References Cited

U.S. PATENT DOCUMENTS

| | | |
|---|---|---|
| 4,810,664 A | 3/1989 | Kamins et al. |
| 4,974,051 A | 11/1990 | Matloubian et al. ........ 257/347 |
| 5,128,733 A | 7/1992 | Tyson ........................ 357/23.7 |
| 5,185,280 A | 2/1993 | Houston et al. |
| 5,674,760 A | 10/1997 | Hong |
| 5,770,881 A | 6/1998 | Pelella et al. ................ 257/347 |
| 5,872,044 A * | 2/1999 | Hemmenway et al. ....... 438/426 |
| 5,889,314 A | 3/1999 | Hirabayashi ................. 257/508 |
| 5,894,152 A | 4/1999 | Jaso et al. ................... 257/347 |

FOREIGN PATENT DOCUMENTS

JP   10-17001   1/1999   ......... H01L/21/762

* cited by examiner

*Primary Examiner*—Douglas A. Wille
*Assistant Examiner*—Theresa T. Doan
(74) *Attorney, Agent, or Firm*—Finnegan, Henderson, Farabow, Garrett & Dunner, L.L.P.

(57) ABSTRACT

The present invention provides an SOI device preventing the floating body effect, and a method for manufacturing the same. Disclosed is a method comprising the steps of: forming an isolation layer on a first silicon substrate; forming a conductive layer on the isolation layer and the first silicon substrate; forming a buried insulating layer on the conductive layer; bonding the second silicon substrate so as to contact with the buried insulating layer; exposing the isolation layer by removing backside of the first silicon substrate by selected thickness thereby defining a semiconductor layer; forming a transistor by forming a gate electrode, a source region and a drain region at selected portions of the semiconductor layer; etching a selected portion of the isolation layer so as to expose the conductive layer; and forming a body electrode to be contacted with the conductive layer within the isolation layer.

8 Claims, 6 Drawing Sheets

SOI SEMICONDUCTOR DEVICE CAPABLE OF PREVENTING FLOATING BODY EFFECT

This is a division of application Ser. No. 09/468,518, filed Dec. 21, 1999, now U.S. Pat. No. 6,313,507 which is incorporated herein by reference.

BACKGROUND OF THE INVENTION

1. Field of the Invention

The present invention generally relates to a silicon-on-insulator (SOI) semiconductor device, and more particularly, to an SOI semiconductor device capable of preventing floating body effect of the SOI device and method of manufacturing the same.

2. Description of the Related Art

As semiconductor devices have high performance, the SOI substrate (hereinafter "SOI device") has been suggested remarkably instead of silicon substrate made of bulk silicon. The SOI substrate comprises a handling wafer as a supporting part, a buried insulating layer and a semiconductor layer on which a device is formed later. An SOI device formed on an SOI substrate is completely isolated by a buried oxide layer and field oxide layer, and a junction capacitance is reduced, thereby achieving low power consumption and fast operation.

FIG. 1 is a cross-sectional view showing a conventional SOI device in which a transistor is formed. As shown in the drawing, an SOI substrate 10 comprising a handling wafer 11, a buried insulating layer 12 and a semiconductor layer 13, is provided. A field oxide layer 14 is formed on a selected portion of the semiconductor layer 13 of the SOI substrate 10 thereby defining an active region. A bottom of the field oxide layer 14 is in contact with the buried insulating layer 12. A gate electrode 16 having a gate insulating layer 15 is formed at a selected portion of the semiconductor layer 13, and a sidewall spacer 17 is formed of an insulating layer at both sidewalls of the gate electrode 16. Junction regions 18a, 18b are formed at the semiconductor layer 13 of both sidewalls of the gate electrode 16. Bottoms of the junction regions 18a, 18b are in contact with the buried insulating layer 12.

In a transistor formed on such SOI substrate, the junction regions 18a, 18b are in contact with the buried insulating layer 12 and the junction capacitance is lower than the bulk silicon device, thereby performing fast operation. Further, if the thickness of the semiconductor layer 13 is below 100 nm, on-current of the transistor can be increased.

However, if the semiconductor layer 13 on which a transistor is formed later is separated by the field oxide layer 14 and the buried insulating layer 12, and the semiconductor layer 13 is formed of thin film, then potential within a channel region is higher than that within a conventional MOS transistor when the channel layer is completely depleted. Moreover, a potential barrier between source region and the channel region is lowered. Holes generated by the impact ions of the depletion layer at the drain side, are temporarily stored in the channel region. By doing so, potential in the channel region is raised and electrons are rapidly injected from the source region to the channel region. Thus, the floating body effect, i.e. a decrease of voltage between the source and the drain regions, occurs. The floating body effect causes malfunction of semiconductor device.

SUMMARY OF THE INVENTION

The object of the present invention is to provide an SOI device capable of forming thin semiconductor layer and also preventing the floating body effect, and a method for manufacturing the same.

In one aspect, the present invention provides an SOI device comprising: a substrate; a buried insulating layer formed on the substrate; a conductive layer formed on the buried insulating layer; a semiconductor layer formed on the conductive layer; an isolation layer formed on a selected portion of the semiconductor layer and defining an active region; a transistor comprising a gate electrode formed on a selected portion of the active region of the semiconductor layer, and source and drain regions formed at the active regions of both sides of the gate electrode; and a body electrode formed to be contacted with the conductive layer within the isolation layer, and applying a selected degree of voltage to the conductive layer.

In another aspect, the present invention provides a method for fabricating SOI device comprising the steps of: forming an isolation layer on a first silicon substrate; forming a conductive layer on the isolation layer and the first silicon substrate; forming a buried insulating layer on the conductive layer; bonding the second silicon substrate so as to contact with the buried insulating layer; exposing the isolation layer by removing backside of the first silicon substrate by selected thickness thereby defining a semiconductor layer; forming a transistor by forming a gate electrode, a source region and a drain region at selected portions of the semiconductor layer; etching a selected, portion of the isolation layer so as to expose the conductive layer; and forming a body electrode to be contacted with the conductive layer within the isolation layer.

BRIEF DESCRIPTION OF THE DRAWINGS

The foregoing and other objects, aspects advantages will be better understood from the following detailed description of the invention with reference to the drawings, in which.

DETAILED DESCRIPTION OF THE INVENTION

Hereinafter, a preferred embodiment of this invention will be explained in detail with reference to the accompanying drawings.

Figure 1:
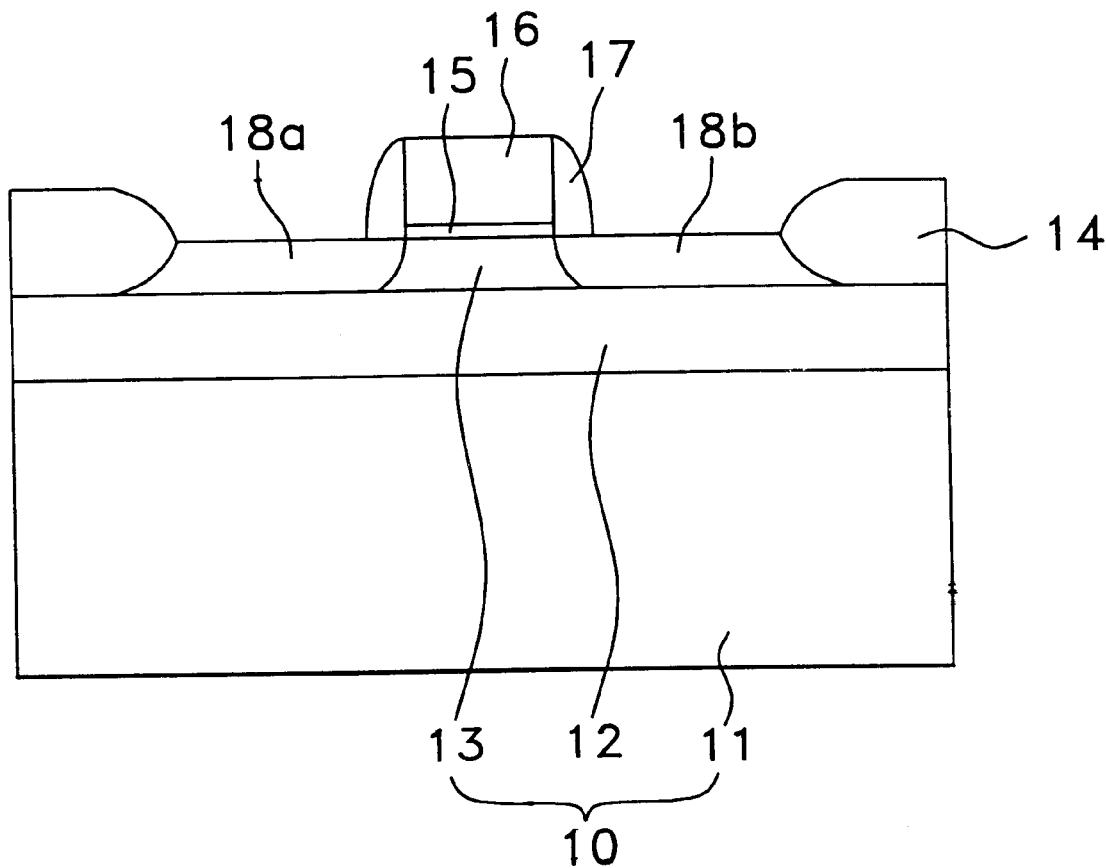
FIG. 1 is a cross-sectional view showing a conventional SOI device.
Figure 2A:
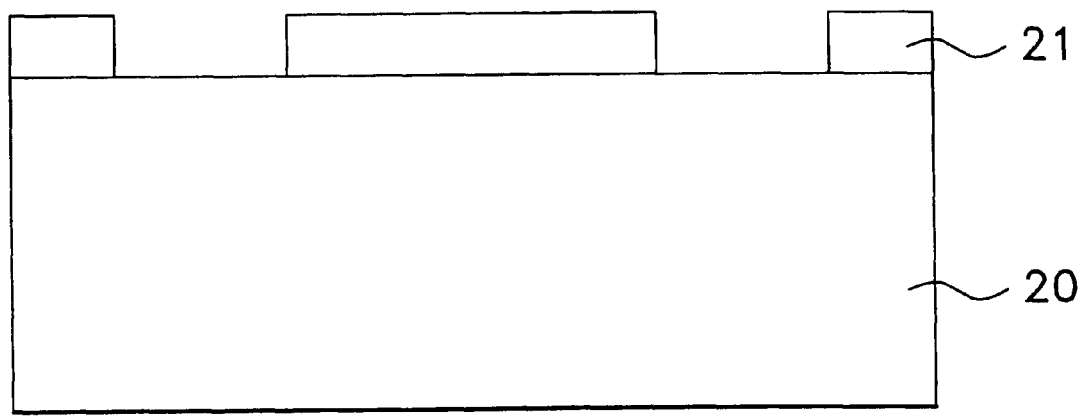
FIGS. 2A, 2B, 2C, 2D, 2E, 2F, 2G, 2H, and 2I are cross-sectional views for showing the method for fabricating a SOI device according to the present invention.

Referring to FIG. 2A, a photoresist pattern 21 is formed at a selected portion of a first silicon substrate 20 so that an isolation region to be formed later on is exposed.

Figure 2B:
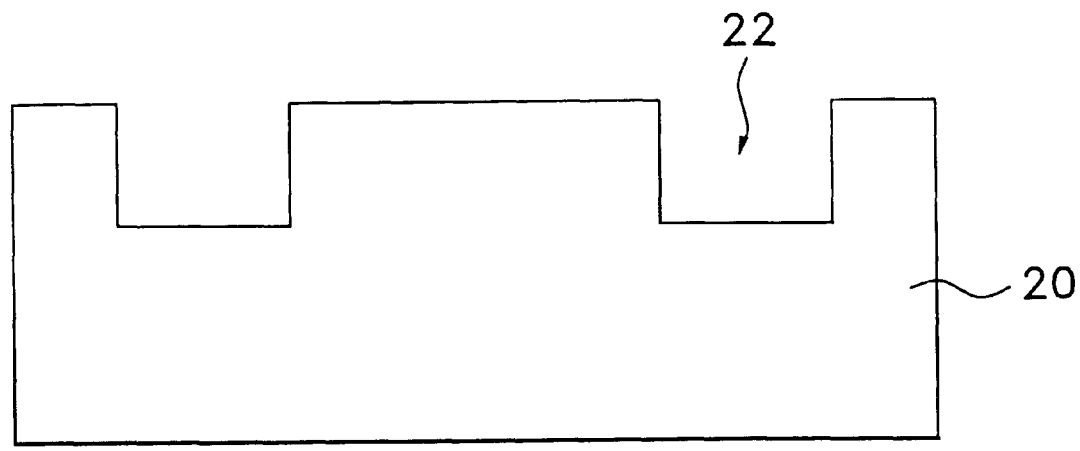

Referring to FIG. 2B, by using the photoresist pattern 21 as a mask, the exposed first silicon substrate is etched to a selected depth thereby forming a trench 22. The thickness of a semiconductor layer to which a device is formed is selected according to the depth of the trench 22. In this embodiment, the thickness of trench 22 is set below 100 nm approximately.

Figure 2C:
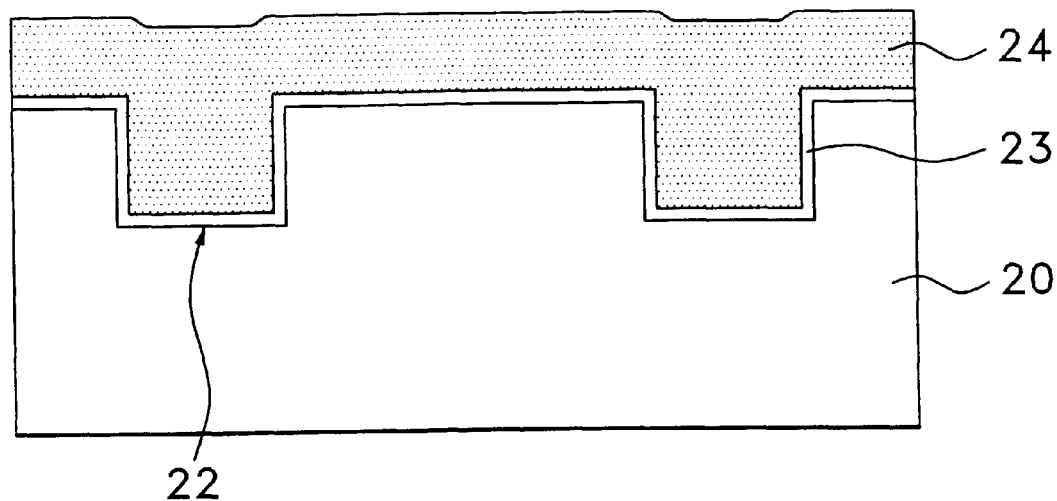

As shown in FIG. 2C, a thermal oxide layer 23 is formed by a known thermal oxidation process on the first silicon substrate 20 in which the trench 22 is formed. An oxide layer 24 for trench-filling is formed with thickness sufficient to fill the trench 22 according to the chemical vapor deposition (CVD) method.

Figure 2D:
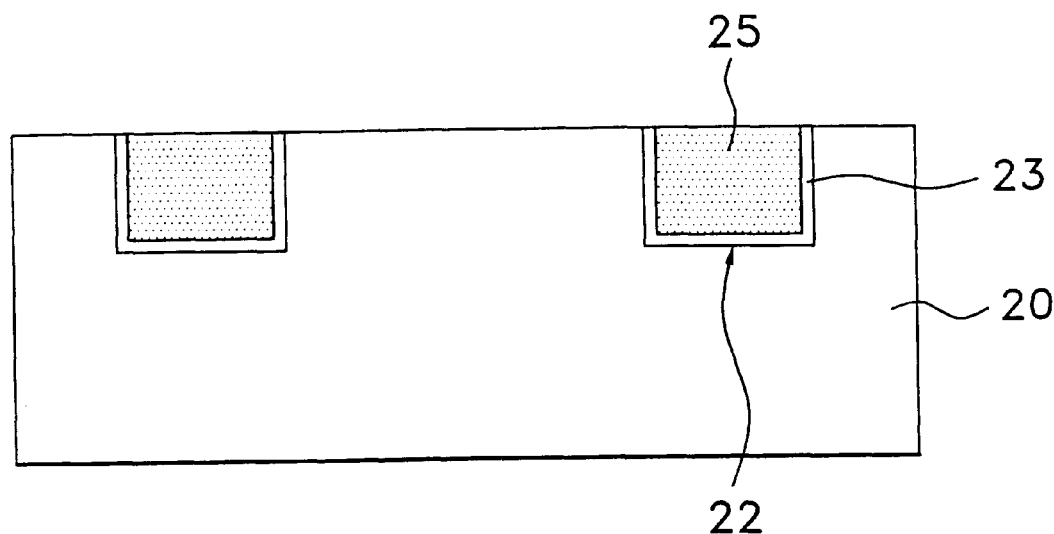

Next, referring to FIG. 2D, the oxide layer 24 for trench-filling is etched-back or chemical mechanical polished until a surface of the first silicon substrate 20 is exposed, thereby forming a trench isolating layer 25 within the trench 22.

Figure 2E:
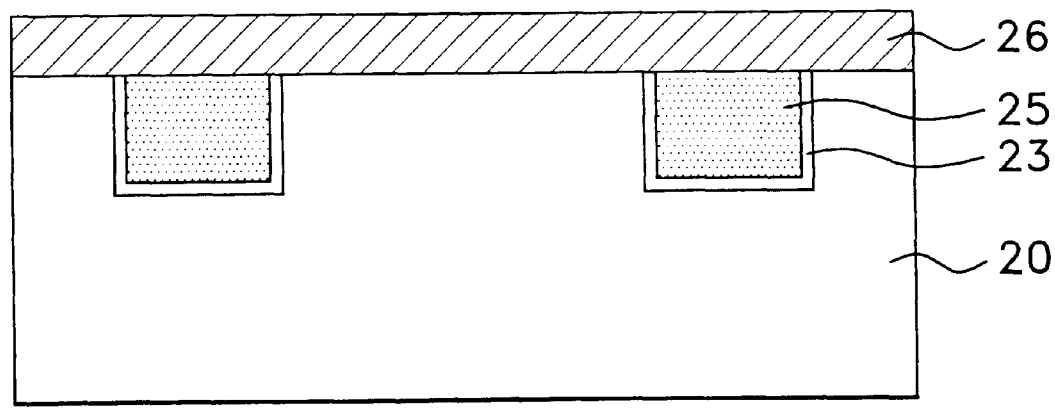

As shown in FIG. 2E, a conductive layer 26 for preventing the floating body effect is formed with thickness of below 100 nm on the first silicon substrate 20 in which the trench 22 is formed. The conductive layer 26 is formed of, for example a doped-silicon layer or a doped-polysilicon layer. At this time, the conductive layer 26 is formed by the method of LPCVD (low pressure chemical vapor deposition), PECVD (plasma enhanced chemical vapor deposition), ECR (electron cyclone resonator), APCVD (atmosphere pressure chemical vapor deposition) or photo-CVD (chemical vapor deposition). Further, when the conductive layer is formed of the doped-silicon layer or the doped-polysilicon layer, dopant can be injected at the same time the conductive layer 26 is deposited. Also, the conductive layer 26 can be formed of intrinsic silicon layer or intrinsic polysilicon layer, and then the $POCl_3$ doping or impurities can be further injected. At this time, the type of the impurities injected to the conductive layer 26 is preferably opposite to the type of an SOI device to be formed later on. For instance, if an NMOS is planned to be formed, P type impurities, e.g., B ions, are injected into the conductive layer 26, and if a PMOS is planned to be formed, N type impurities, e.g., P ions, are injected into the conductive layer 26.

Figure 2F:
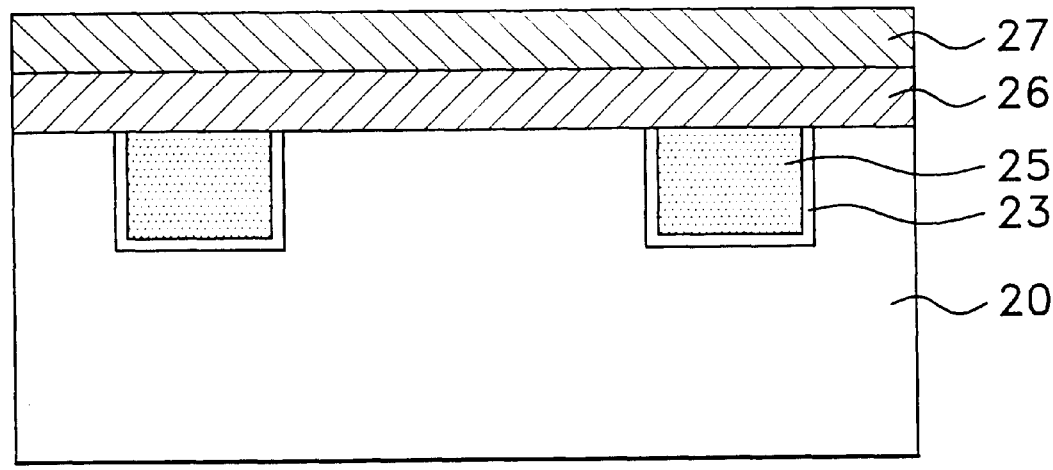

As shown in FIG. 2F, a buried insulating layer 27 is deposited on the conductive layer 26 according to the CVD method or the thermal oxidation process.

Figure 2G:
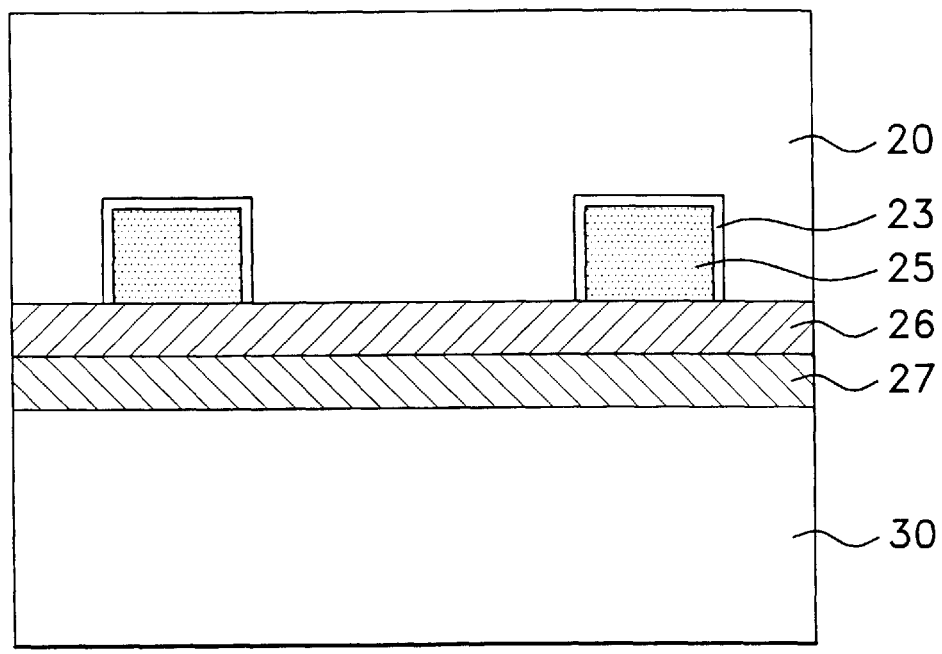

Next, as shown in FIG. 2G, one face of a second silicon substrate 30 for handling is bonded with the buried insulating layer 27 of the first silicon substrate 20. The second silicon substrate 30 and the first silicon substrate 20 are thermally attached at a selected temperature.

Figure 2H:
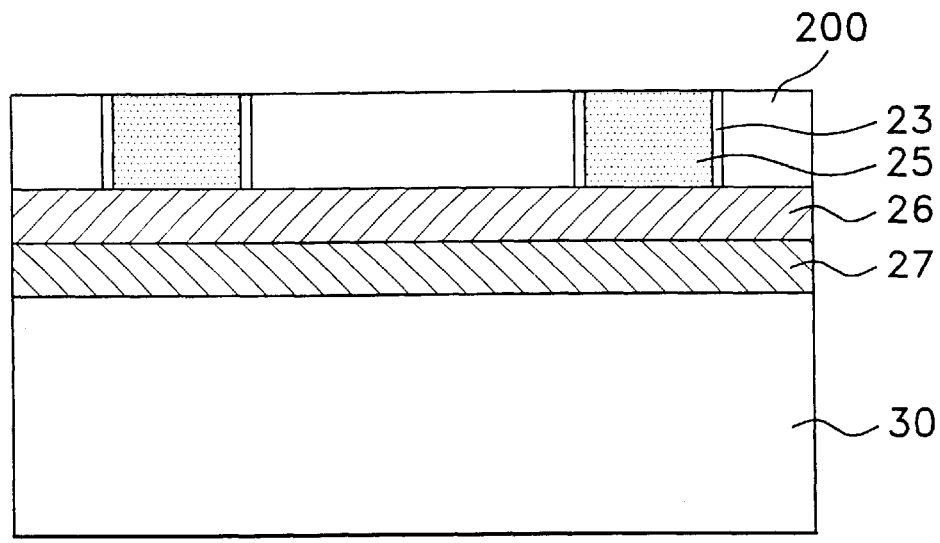

As shown in FIG. 2H, the first silicon substrate 20 is grinded and polished to expose the surface of trench isolating layer 25, thereby forming a semiconductor layer 200. At this time, an active region is defined in the semiconductor layer 200 by the trench isolating layer 25. Therefore, an SOI substrate is completed.

Figure 2I:
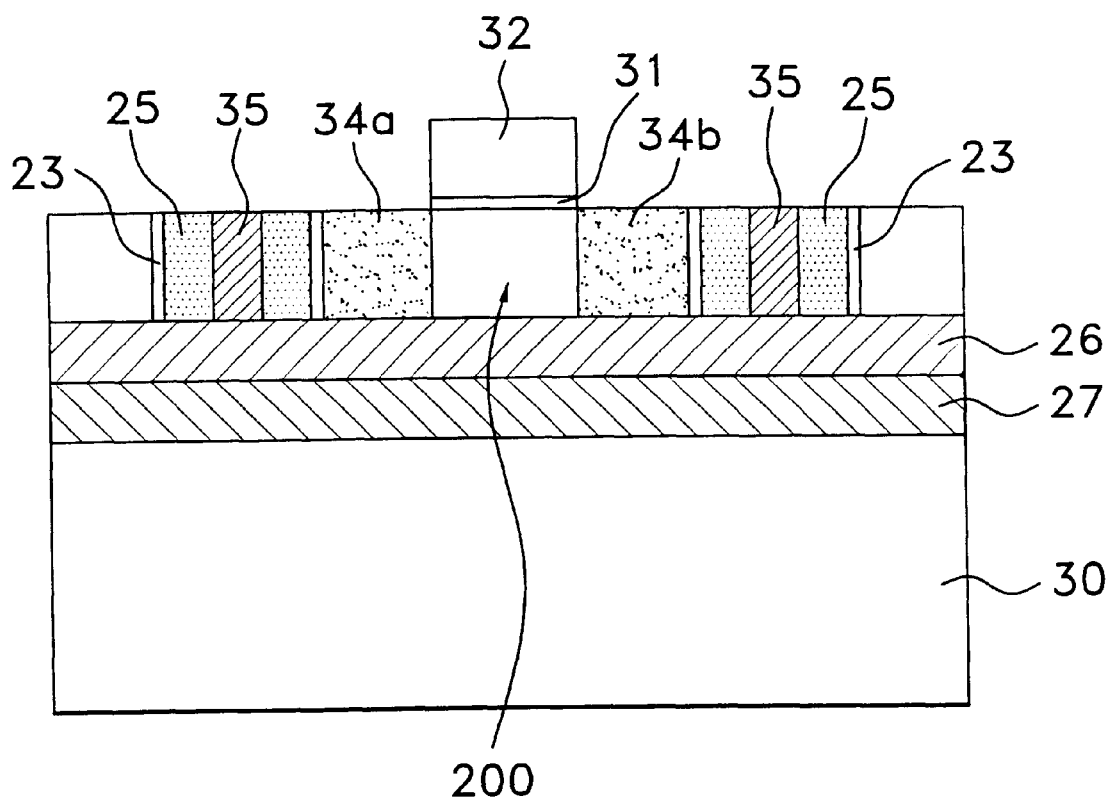

Afterward, referring to FIG. 2I, a gate oxide layer 31 and a gate electrode 32 are formed at a selected portion of the semiconductor layer 200. At this time, the gate electrode 32 is formed of a doped-polysilicon layer. Impurities are injected into the semiconductor layer 200 between the gate electrode 32 and the trench isolating layer 25 thereby forming source and drain regions 34a, 34b. Afterward, a selected portion of the trench isolating layer 25 is etched so that a selected portion of the conductive layer 26 is exposed. Next, a body electrode 35 is formed in the trench isolating layer 25 so as to contact with the exposed conductive layer 26. Herein, the conductive layer 26 contacts the semiconductor layer 200, thereby preventing a floating of the semiconductor layer 200.

Operation of the SOI device is as follows.

When voltage above threshold voltage is applied to the gate electrode 32, current flows between the source and the drain regions 34a, 34b. At this time, energy of electrons (in the case of a NMOS device) flowing in the channel increases by the voltage applied to the drain region 34b. Thus, the electrons having high energy crash with silicon lattice at the drain region 34b, thereby creating electrons and holes due to impact ionization. At this time, the newly created electrons flow into the drain region according to the electric field, and holes are gathered from the channel region to the source region 34a having lower potential. However, in the present invention, since the semiconductor layer 200 is in contact with the conductive layer 26 to which a selected voltage is applied, the potential of a channel region which is formed at the semiconductor layer by the conductive layer 26 is adjusted. That is to say, since a lower voltage such as ground voltage is continuously applied to the body electrode 35, holes (minority of carriers) occurring when the transistor is turned on, are discharged toward the body electrode 35, thereby preventing the body floating effect.

As discussed above, according to the present invention, a conductive layer is formed between the semiconductor layer and the buried insulating layer so as to adjust the potential of the channel layer. Because the potential of the channel region is adjustable, the floating body effect is completely prevented, even though the semiconductor layer on which an SOI device is formed later is formed of a thin film.

While the present invention has been described with reference to certain preferred embodiment, various other modifications will be apparent to and can be readily made by those skilled in the art without departing from the scope and spirit of the present invention.

What is claimed is:

1. A method for fabricating SOI semiconductor device comprising the steps of:

forming an isolation layer on a first silicon substrate;

forming a conductive layer on the isolation layer and the first silicone substrate;

forming a buried insulating layer on the conductive layer;

bonding a second silicon substrate so as to contact with the buried insulating layer;

exposing the isolation layer by removing backside of the first silicon substrate by selected thickness thereby defining a semiconductor layer;

forming a transistor by forming a gate electrode, a source region and a drain region at selected portions of the semiconductor layer;

etching a selected portion of the isolation layer so as to expose the conductive layer; and forming a body electrode to be contacted with the conductive layer within the isolation layer.

2. The method of claim 1, wherein the step of forming the isolation layer further comprises the steps of:

forming a trench by etching an isolation region to be formed later on at the first silicon substrate by a selected depth;

forming a thermal oxide layer on a surface of the trench;

forming an oxide layer for filling on the thermal oxide layer; and chemical mechanical polishing the oxide layer for filling until a surface of the first silicon substrate is exposed.

3. The method of claim 1, wherein the conductive layer is formed of a doped-silicon layer or a doped-semiconductor layer.

4. The method of claim 3, wherein a dopant injected in the conductive layer has different type from a dopant injected in the source and the drain regions.

5. The method of claim 4, wherein the conductive layer is formed according to a method of LPCVD(low pressure chemical vapor deposition), PECVD(plasma enhanced chemical vapor deposition), ECR(electron cyclone resonator), APCVD(atmosphere pressure chemical vapor deposition) or photo-CVD(chemical vapor deposition).

6. The method of claim 4, wherein in the step of forming the conductive layer, dopants are injected at the same time the conductive layer is deposited.

7. The method of claim 4, wherein the step of forming the conductive layer further comprises the steps of: injecting silicon or polysilicon in the intrinsic state; and further injecting impurities to the silicon or polysilicon.

8. The method of claim 1, wherein the buried insulating layer s deposited by the CVD process or the thermal oxidation process.

* * * * *